(12) United States Patent
Brown

(10) Patent No.: US 6,899,607 B2
(45) Date of Patent: May 31, 2005

(54) POLISHING SYSTEMS FOR USE WITH SEMICONDUCTOR SUBSTRATES INCLUDING DIFFERENTIAL PRESSURE APPLICATION APPARATUS

(75) Inventor: Nathan R. Brown, Cedar Park, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/715,248

(22) Filed: Nov. 17, 2003

(65) Prior Publication Data

US 2004/0102144 A1 May 27, 2004

Related U.S. Application Data

(62) Division of application No. 09/912,982, filed on Jul. 25, 2001.

(51) Int. Cl.$^7$ .................................................. B24B 7/20
(52) U.S. Cl. ........................................ 451/288; 451/285
(58) Field of Search ............................... 451/285–288; 156/345.14

(56) References Cited

U.S. PATENT DOCUMENTS

| | | | |
|---|---|---|---|
| 4,606,151 A | | 8/1986 | Heynacher |
| 5,432,395 A | | 7/1995 | Grahn |
| 5,607,341 A | * | 3/1997 | Leach .......................... 451/41 |
| 5,836,807 A | * | 11/1998 | Leach .......................... 451/41 |
| 6,028,669 A | | 2/2000 | Tzeng |
| 6,050,878 A | | 4/2000 | Kanzo et al. |
| 6,050,882 A | | 4/2000 | Chen |
| 6,056,632 A | | 5/2000 | Mitchel et al. |
| 6,059,638 A | | 5/2000 | Crevasse et al. |
| 6,179,956 B1 | | 1/2001 | Nagahara et al. |
| 6,315,634 B1 | | 11/2001 | Jensen et al. |
| 6,354,928 B1 | | 3/2002 | Crevasse et al. |
| 6,390,901 B1 | * | 5/2002 | Hiyama et al. .............. 451/285 |
| 6,390,905 B1 | * | 5/2002 | Korovin et al. ............. 451/286 |
| 6,394,882 B1 | * | 5/2002 | Chen ............................. 451/41 |
| 6,435,948 B1 | * | 8/2002 | Molnar ......................... 451/41 |
| 6,436,828 B1 | | 8/2002 | Chen et al. |
| 6,443,821 B1 | * | 9/2002 | Kimura et al. ............ 348/231.6 |
| 6,447,368 B1 | * | 9/2002 | Fruitman et al. .............. 451/5 |
| 6,506,105 B1 | * | 1/2003 | Kajiwara et al. ............ 451/289 |
| 6,558,232 B1 | * | 5/2003 | Kajiwara et al. ............. 451/41 |
| 6,592,434 B1 | * | 7/2003 | Vanell et al. .................. 451/41 |
| 6,612,903 B2 | * | 9/2003 | Korovin et al. ................ 451/9 |
| 6,623,343 B2 | * | 9/2003 | Kajiwara et al. ............ 451/398 |
| 6,659,850 B2 | * | 12/2003 | Korovin et al. ............. 451/286 |
| 6,719,615 B1 | * | 4/2004 | Molnar ......................... 451/41 |
| 6,725,120 B2 | | 4/2004 | Saldana |

OTHER PUBLICATIONS

Part IV Electricity and Magnetism, Chapter 23 Electric Fields, pp. 625–649.

* cited by examiner

Primary Examiner—David B. Thomas
(74) Attorney, Agent, or Firm—TraskBritt

(57) ABSTRACT

An apparatus for applying different amounts of pressure to different locations of a backside of a semiconductor device structure during polishing thereof. The apparatus is configured to be associated with a wafer carrier of a polishing apparatus and includes pressurization structures configured to be biased against the backside of the semiconductor device structure during polishing thereof. The pressurization structures are independently movable with respect to one another. The amount of force or pressure applied by each pressurization structure to the backside of the semiconductor device structure is controlled by at least one corresponding actuator. The actuator may magnetically facilitate movement of the corresponding pressurization structure toward or away from the backside of the semiconductor device structure. The actuator may alternatively comprise a positive or negative pressure source. Systems including the pressure application apparatus, as well as differential pressure application methods and polishing methods are also disclosed.

21 Claims, 7 Drawing Sheets

POLISHING SYSTEMS FOR USE WITH SEMICONDUCTOR SUBSTRATES INCLUDING DIFFERENTIAL PRESSURE APPLICATION APPARATUS

CROSS-REFERENCE TO RELATED APPLICATION

This application is a divisional of application Ser. No. 09/912,982, filed Jul. 25, 2001, pending.

BACKGROUND OF THE INVENTION

1. Field of the Invention

The present invention relates generally to apparatus that apply pressure to the backsides of semiconductor device structures during polishing or planarization of one or more layers thereof. Particularly, the present invention relates to apparatus that selectively apply different amounts of pressure to different locations on the backsides of semiconductor device structures as one or more layers on the opposite, active surfaces thereof are polished or planarized. More particularly, the present invention relates to apparatus that employ magnetic fields to independently apply pressure to different, selected locations on the backside of a semiconductor device structure. The present invention also relates to polishing methods wherein different amounts of pressure are selectively applied to different locations on the backside of a semiconductor device structure, as well as to systems for effecting such methods.

2. Background of Related Art

Chemical-mechanical polishing and chemical-mechanical planarization are abrasive techniques that typically include the use of a combination of chemical and mechanical agents to planarize, or otherwise remove material from, a surface of a semiconductor material substrate bearing devices under fabrication. Such a structure may be referred to for the sake of convenience as a "semiconductor device structure." A chemical component, typically a slurry that includes one or more oxidizers, abrasives, complexing agents, and inhibitors, oxidizes the surface of one or more material layers that are being polished or planarized (i.e., at least partially removed). A polishing pad, or CMP pad, is used with the slurry and, along with abrasives present in the slurry, effects mechanical removal of the layer or layers from the surface of the semiconductor device structure. It should be noted that abrasive-only polishing and planarization, e.g., without the use of active chemical agents to effect material removal, are becoming more prevalent due to environmental concerns. Thus, the term "CMP" as used herein encompasses such abrasive-only methods and apparatus.

Conventional CMP pads are round and planar and have larger dimensions than the semiconductor substrates (e.g., wafers or other substrates including silicon, gallium arsenide, indium phosphide, etc.) upon which the structures or layers to be polished have been formed. In polishing one or more layers of structures formed on a substrate, the substrate and the conventional CMP pad are rotated relative to one another, with the location of the substrate being moved continuously relative to the polishing surface of the pad so that different areas of the pad are used to polish one or more of the layers or structures formed on the substrate.

When conventional polishing processes are used, the surface of a semiconductor device structure following polishing thereof is often not planar. Due to the rotation of at least the semiconductor device structure during polishing, the periphery of the semiconductor device structure moves at a faster rate than the center thereof. Thus, material is removed from the periphery of a rotated semiconductor device structure more quickly than material is removed from more central regions of the semiconductor device structure.

In addition, although the inhibitors of a slurry function to even out the polishing rate across nonplanar surfaces, polishing of structures with initially great differences in height may not result in a planar surface, but may result in a surface with raised "rings".

As exemplified by U.S. Pat. No. 6,050,882 to Chen (hereinafter "Chen"), attempts have been made to increase the planarity to which semiconductor device structures are polished. Chen discloses a wafer carrier head apparatus that includes independently movable rods. Rods that are located outside of the periphery of a semiconductor device structure assembled with the carrier head extend at least partially downward to laterally confine the semiconductor device structure during polishing of one or more layers thereof. Rods that contact the backside of the semiconductor device structure are biased against all locations of the backside with equal amounts of pressure or force provided by positive air pressure applied to a single pressurizable bladder located above all of the rods. Chen also discloses another embodiment of the carrier head, wherein a pressurizable chamber may be located centrally relative to the rods so as to apply pressure to the central region of a semiconductor device structure assembled with the carrier head or to act as a vacuum chuck when a negative pressure is applied to the chamber. The chamber may be used to apply a different amount of pressure to the backside of the semiconductor device structure than that applied to the peripheral regions of the backside of the semiconductor device structure by the rods. Nonetheless, the carrier heads of Chen do not facilitate the application of different amounts of pressure to different, selected locations on the backside of a semiconductor device structure in response to preventing nonplanarities at specific locations on the active surface of the semiconductor device structure. Moreover, as the carrier heads of Chen are configured to apply only one or two different amounts of pressure to a semiconductor device structure during polishing thereof, these carrier heads will not adequately compensate for nonplanarities that may be formed during polishing but, rather, may accentuate these nonplanarities.

Accordingly, it appears that the art lacks apparatus for applying selected amounts of pressure to one or more different, selected locations on the backsides of semiconductor device structures during polishing thereof, as well as methods for selectively applying pressure to selected locations on the backside of a semiconductor device structure during polishing thereof.

SUMMARY OF THE INVENTION

The present invention includes polishing methods and apparatus with which substantially planar surfaces may be formed on semiconductor device structures during polishing thereof.

In one aspect of the present invention, a surface of a polished semiconductor device structure is analyzed to identify one or more locations thereon where material was removed at a slower rate than remaining locations on the surface. Areas on the surface of the semiconductor device structure where material is removed at decreased rates will typically be higher than, or raised above, other areas on the surface. By increasing the amount of friction between the surface of the semiconductor device structure and a polishing pad at these raised areas, the rate of material removal may be increased. In the present invention, the friction at these raised areas is increased by applying force to the backside of the semiconductor device structure, opposite each raised area on the active surface thereof. The amount of force to be applied to the backside, opposite each raised area, depends upon the height of the raised area relative to the lowest area on the surface of the semiconductor device structure. Thus, the amount of force that is applied to one location or to different locations on the backside of the semiconductor device structure may be determined based on the difference in height between each raised area and the lowest area or areas on the active surface of the semiconductor device structure and by determining the amount of friction needed at each of these areas to provide a substantially constant material removal rate across the entire surface of the semiconductor device structure and to form a substantially planar surface on the semiconductor device structure during polishing thereof.

The present invention includes a differential pressure application apparatus that selectively applies different amounts of pressure to different locations on the backside of a semiconductor device structure, such as a wafer, upon which a plurality of semiconductor devices is being fabricated. The differential pressure application apparatus includes a plurality of independently movable pressurization structures that are configured to be biased against different locations on the backside of a semiconductor device structure. A controller, or actuator, corresponds to each of the pressurization structures and is configured to bias the corresponding pressurization structure against the backside of the semiconductor device structure with a selected amount of force or pressure, the latter being defined as the force-per-unit area.

The controllers are preferably magnets. Thus, each controller may be formed from a magnetic material or comprise an electromagnet. The pressurization structures, which may be formed from either a magnetic material or a material that is attracted to a magnetic field, each move in response to relative movement of the corresponding magnetic controller.

For example, if the pressurization structures are formed from a magnetic material, the controllers may be located and oriented so as to bias the corresponding pressurization structures against the backside of a semiconductor device structure by repulsion. Of course, like magnetic poles of a controller and its corresponding pressurization structure must face one another for the magnetic controller to repel the corresponding magnetic pressurization structure. The amount of repulsion, or the amount of force with which the pressurization structure is biased against the backside of the semiconductor device structure, depends upon the magnetic field strengths of the controller and its corresponding pressurization structure, as well as upon the amount of movement desired or closeness of the controller to its corresponding pressurization structure.

Alternatively, a magnetic controller may be located and oriented so as to attract a corresponding magnetic pressurization structure toward the backside of a semiconductor device structure. Of course, such attraction is effected by positioning a magnetic controller and its corresponding magnetic pressurization structure so that opposite magnetic poles of the controller and pressurization structure face one another. As the desired direction of movement for the pressurization structures is toward the semiconductor device structure, when magnetic attraction is used to bias the pressurization structures against the backside of a semiconductor device structure, the magnetic controllers are positioned on the side of the semiconductor device structure opposite from the magnetic pressurization structures.

Alternatively, the pressurization structures may be configured so that they are biased against the backside of a semiconductor device structure when substantially no magnetic field is applied to the pressurization structures. For example, the pressurization structures may be resiliently biased (e.g., by springs) against the backside of a semiconductor device structure. When sufficient magnetic fields are applied to these resiliently biased pressurization structures, the pressurization structures begin to be moved away from the backside of the semiconductor device structure. Thus, the amount of force with which each pressurization structure is biased against the backside of a particular location of a semiconductor device structure may be selectively reduced, or such force may be substantially completely removed. In such a configuration of the differential pressure application apparatus, the pressurization structures may be formed from either a magnetic material or a material that is attracted to a magnetic field. Of course, the relative locations and orientations of the pressurization structures and their corresponding controllers depend upon the type of material from which the pressurization structures are made, as well as whether magnetic repulsion or attraction is used to bias each pressurization structure against the backside of a semiconductor device structure with a selected amount of force.

As the selective application of different amounts of pressure to the backside of a semiconductor device structure is particularly useful in polishing one or more layers of the semiconductor device structure so as to form a substantially planar surface thereon, the pressurization structures of the present invention may be incorporated into a wafer carrier of a polishing apparatus. A semiconductor device structure, such as a wafer with distinct semiconductor devices being fabricated thereon, may be secured to the wafer carrier as known in the art, such as by use of a clamping structure that physically secures at least a portion of the periphery of the semiconductor device structure or a vacuum applied to the backside of the semiconductor device structure through spaces between adjacent pressurization structures.

Depending upon the manner in which the pressurization structures are to be biased by their corresponding controllers against the backside of the semiconductor device structure, the controllers may also be associated with the wafer carrier, or may be located on a side of a polishing pad opposite from the wafer carrier, with corresponding pressurization structures and controllers being kept in constant alignment. If the controllers are located on a side of a polishing pad opposite from their corresponding pressurization structures, lateral movement of the controllers relative to the polishing pad substantially mirrors lateral movement of the pressurization structures contained within the wafer carrier.

Methods and systems for planarizing semiconductor device structures that incorporate teachings of the present invention are also within the scope of the present invention.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate exemplary embodiments of the invention.

DETAILED DESCRIPTION OF THE INVENTION

Figure 1:
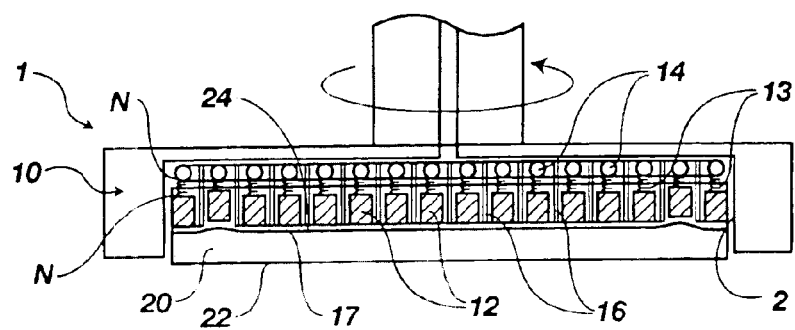
FIG. 1 is a cross-sectional representation of a first embodiment of an apparatus embodying teachings of the present invention, illustrating a semiconductor device structure assembled therewith and secured thereto.
Figure 2:
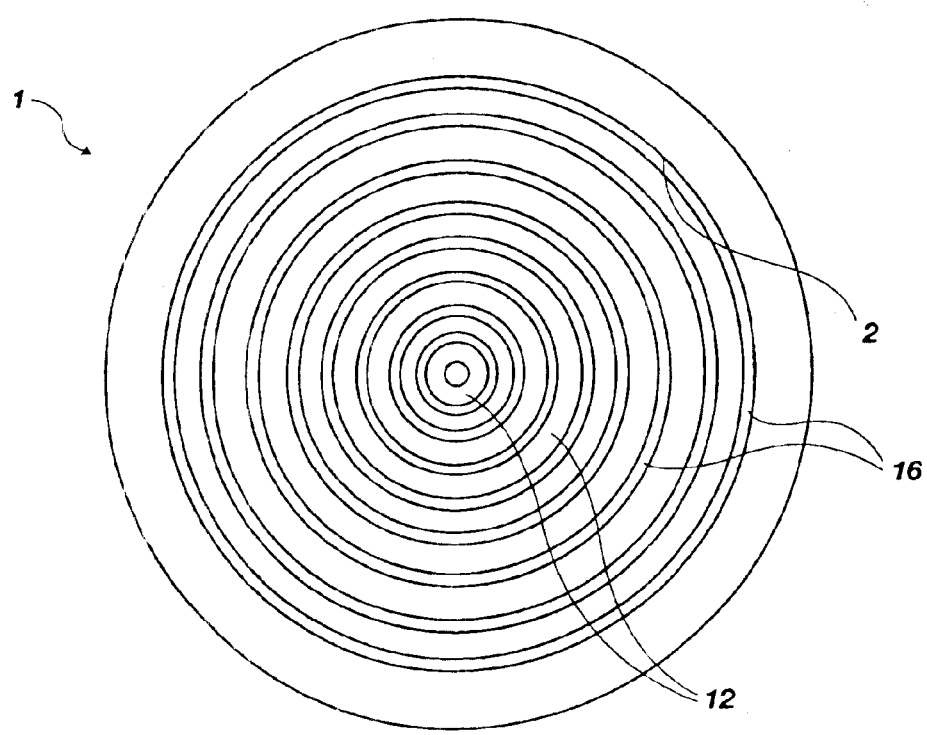
FIG. 2 is a bottom plan view of the apparatus illustrated in FIG. 1.

With reference to FIGS. 1 and 2, a wafer carrier 1 including an exemplary pressure application apparatus 10 that incorporates teachings of the present invention is illustrated. As shown in FIG. 1, pressure application apparatus 10 is located within wafer carrier 1 within a receptacle 2 for receiving at least a backside 24 portion of a semiconductor device structure 20.

Various types of semiconductor device structures 20 may be assembled with and secured to wafer carrier 1, including, without limitation, full or partial wafers of silicon or other semiconductive materials (e.g., gallium arsenide or indium phosphide), as well as other large-scale substrates (e.g., a silicon-on-insulator (SOI) substrate, such as silicon-on-glass (SOG), silicon-on-ceramic (SOC), silicon-on-sapphire (SOS), or the like).

Pressure application apparatus 10 includes a plurality of independently, substantially vertically movable pressurization structures 12, each of which are configured to be biased against the backside 24 of a semiconductor device structure 20 assembled with wafer carrier 1. Preferably, pressurization structures 12 apply pressure to backside 24 in a direction that is perpendicular to a plane of semiconductor device structure 20 so as to prevent rutting on an active surface 22 of semiconductor device structure 20, which may occur if a pressurization structure 12 tilts. Pressure application apparatus 10 also includes a plurality of actuators 14, which are preferably magnetic controllers, each of which corresponds to a pressurization structure 12. Known processes, such as the application of a negative pressure to backside 24 of semiconductor device structure 20, may be used to secure semiconductor device structure 20 within a receptacle 2 of wafer carrier 1 during polishing.

As nonplanarities that arise from polishing are typically in the form of raised rings, each pressurization structure 12 may be configured as a ring, as shown in FIG. 2, so as to apply an appropriate amount of force to an annular-shaped region of backside 24 of a semiconductor device structure 20 assembled with wafer carrier 1 to achieve a desired pressure on backside 24 throughout a corresponding annular region thereof. This pressure counteracts the tendency of annular-shaped nonplanarities to form on corresponding annular regions of the opposite, polished active surface 22 of semiconductor device structure 20. The portions of pressurization structures 12 that are biased against backside 24 of semiconductor device structure 20 may be substantially flat so as to reduce or eliminate the application of localized force on backside 24, which could cause semiconductor device structure 20 to fracture or otherwise damage semiconductor device structure 20. Pressurization structures 12 may also be relatively tall structures so as to prevent binding between adjacent pressurization structures 12 or between a pressurization structure 12 and a corresponding sleeve 16.

In the embodiment of pressure application apparatus 10 illustrated in FIGS. 1 and 2, each pressurization structure 12 comprises a magnet with the north pole N being located at the top thereof. The magnetic strengths of pressurization structures 12 are preferably substantially the same. Each pressurization structure is preferably oriented so as to be repelled by a corresponding magnetic actuator 14 aligned therewith and configured similarly thereto.

Apparatus 10 may also include a membrane 17 disposed across receptacle 2 so as to separate pressurization structures 12 from backside 24 of semiconductor device structure 20. Membrane 17, which is preferably formed from a tough, flexible material that permits the transmission of force from pressurization structures 12 to backside 24, may protect backside 24 and, when pressurization structures are lubricated, prevent lubricant from contacting semiconductor device structure 20. By way of example and not to limit the scope of the present invention, polymeric films may be used as membrane 17.

As depicted in FIG. 1, actuators 14 are substantially stationary elements, such as electromagnets, that are configured to emanate differing strengths of magnetic fields. The electromagnets of actuators 14 are oriented such that the north poles N thereof face, or are closest to, the north poles of the corresponding pressurization structures 12. Of course, south poles of pressurization structures 12 and the magnetic fields of the electromagnets of their corresponding actuators 14 may alternatively face one another. When electromagnets are used, the strengths of magnetic fields emanating therefrom depend upon the amount of electrical current applied thereto, which may be varied, as known in the art. Actuators 14 are oriented so that the magnetic fields emanating therefrom will repel the corresponding pressurization structure 12 upon the generation of a magnetic field of at least a threshold strength. The different strengths of magnetic fields that are applied by an actuator 14 to its corresponding pressurization structure 12 determines the amount of force with which the pressurization structure 12 is biased against backside 24 of semiconductor device structure 20. Thus, each actuator 14 of pressure application apparatus 10 is configured to selectively maintain its corresponding pressurization structure 12 out of contact with, or apply substantially no force to, backside 24 of semiconductor device structure 20 or to cause its associated pressurization structure 12 to be biased against backside 24 with a plurality of different amounts of force, or pressure.

Pressure application apparatus 10 may also include a plurality of independent springs 13, each of which is associated with a corresponding pressurization structure 12. Each spring 13 may be a known type of spring that is suitable for maintaining a position of a corresponding pressurization structure 12 relative to a backside 24 of a semiconductor device structure 20 when a corresponding actuator 14 is not acting upon pressurization structure 12. For example, and not to limit the scope of the present invention, spring 13 may be a conventional mechanical, coiled spring, a leaf spring, a Belleville spring, an elastomeric spring, a pneumatic (air) spring, or combinations thereof. In the case of pressure application apparatus 10, each spring 13 is configured and positioned to maintain its corresponding pressurization structure 12 in such a position that substantially no force is applied to backside 24 of semiconductor device structure 20 unless the corresponding actuator 14 causes pressurization structure 12 to be biased against backside 24. Each spring 13 thus pulls its corresponding pressurization structure 12 away from backside 24 of semiconductor device structure 20 in the absence of a magnetic field emanating from the corresponding actuator 14.

Alternatively, pressurization structures 12 may be attracted toward their corresponding actuators 14 to facilitate the application of different amounts of pressure to different locations on backside 24 of semiconductor device structure 20 during polishing of active surface 22 thereof. If pressurization structures 12 are formed from a magnetic material, opposite magnetic poles of pressurization structures 12 and the magnetic fields generated by the electromagnets of their corresponding actuators 14 face each other to facilitate such magnetic attraction. As an alternative, pressurization structures 12 may be formed from a material, such as a ferrous material, that is attracted to the magnetic field generated by the electromagnets of their corresponding actuators 14. In addition, when actuators 14 of pressure application apparatus 10 attract their corresponding pressurization structures 12, springs 13 may be oriented so as to push their corresponding pressurization structures 12 toward backside 24 of semiconductor device structure 20 when a magnetic field is not being applied to that pressurization structure 12. Preferably, when magnetic fields are not being applied to pressurization structures 12, the amounts of pressure applied by springs 13 and their corresponding pressurization structures 12 to backside 24 are substantially the same as one another, so that there is a uniform, constant pressure applied across backside 24 of semiconductor device structure 20.

As shown in FIG. 1, each pressurization structure 12 and its corresponding actuator 14 may be substantially isolated from adjacent pressurization structures 12 and actuators 14 by way of an annular sleeve 16 of a material responsive to magnetic fields and preferably a ferrous, nonmagnetic material. Thus, sleeve 16 may prevent magnetic interference between an actuator 14 and a noncorresponding pressurization structure 12. Sleeve 16 may also act as a bearing structure to prevent lateral movement of pressurization structure 12, substantially confining the movement of pressurization structure 12 to a direction that is substantially perpendicular to the plane of a semiconductor device structure 20 to be assembled with wafer carrier 1. Sleeves 16 may also be coated with a known lubricating material, such as silicone oil, to facilitate movement of pressurization structures 12 within their corresponding sleeves 16. Alternatively, adjacent pressurization structures 12 may prevent one another from moving laterally and, thereby, substantially confine the movement of each pressurization structure 12 to a direction that is substantially perpendicular to a plane of a semiconductor device structure 20 to be assembled with wafer carrier 1.

Figure 1A:
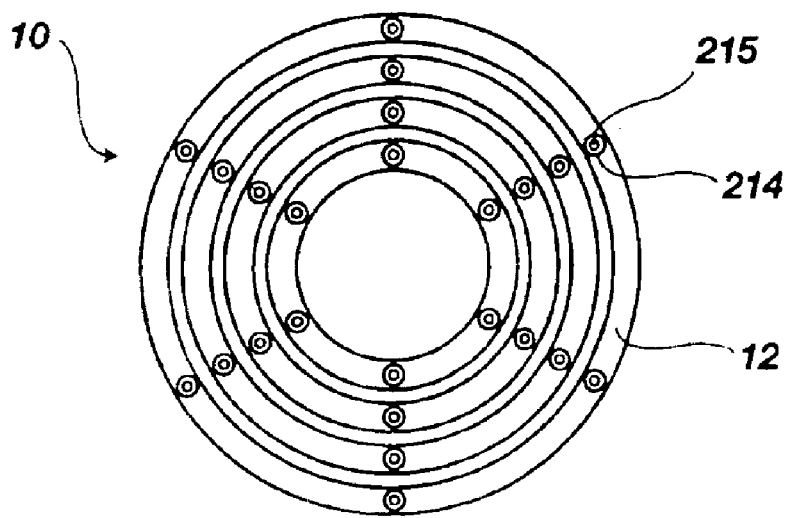
FIGS. 1A and 1B schematically depict a variation of the pressure application apparatus shown in FIG. 1, wherein solenoids are used in place of the electromagnets of the apparatus shown in FIG. 1.
Figure 1B:
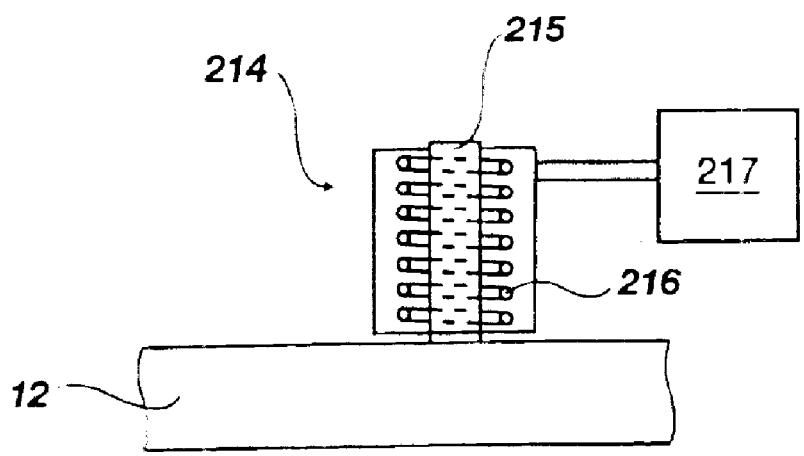

FIGS. 1A and 1B illustrate a variation of the pressurization structure and its associated actuators of a pressure application apparatus 10 incorporating teachings of the present invention. As illustrated, pressurization structure 12 is annular in shape and includes a number of rods 215 protruding upwardly therefrom. Preferably, rods 215 are formed from iron or another ferrous material. Actuators 214 comprise solenoids, each of which includes an electromagnetic coil 216 that is operably connected to a power source 217. A corresponding rod 215 that protrudes from pressurization structure 12 extends through electromagnetic coil 216 of an actuator 214. Upon application of power to electromagnetic coil 216 of the solenoid of each actuator 214, a magnetic field is generated which forces rod 215 downwardly, in turn pushing pressurization structure 12 downward so as to apply pressure to a backside 24 of a semiconductor device structure 20 assembled with a wafer carrier 1, such as those shown in FIG. 1. Of course, other pressure application apparatus incorporating teachings of the present invention may likewise include multiple actuators associated with a single pressurization structure.

Figure 3:
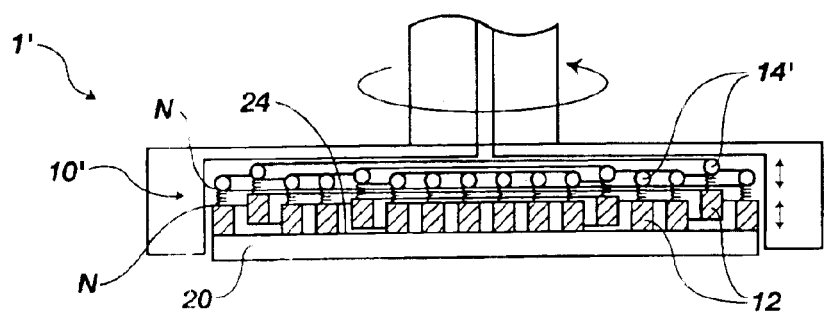
FIG. 3 is a cross-sectional representation of a second embodiment of an apparatus according to the present invention.

An alternative embodiment of pressure application apparatus 10' is shown in FIG. 3. Each of the features of pressure application apparatus 10' are substantially the same as those of pressure application apparatus 10 shown in FIGS. 1 and 2, with the exception that actuators 14' comprise magnets that each emanate a magnetic field of fixed strength and are configured to be moved toward and away from their corresponding pressurization structure 12, as indicated by the arrows. Preferably, each actuator 14' has associated therewith a mechanical component, such as a pneumatically or hydraulically driven piston, that effects the movement thereof toward and away from the corresponding pressurization structure 12. Actuators 14' are oriented so as to repel their corresponding pressurization structures 12 and, therefore, to bias pressurization structures 12 against backside 24 of a semiconductor device structure 20 assembled with wafer carrier 1'. As a magnetic actuator 14' is moved toward its corresponding magnetic pressurization structure 12, the amount of repulsion between pressurization structure 12 and actuator 14' increases. Conversely, as a magnetic actuator 14' is moved away from its corresponding pressurization structure 12, the force of repulsion between pressurization structure 12 and actuator 14' decreases. Thus, the amount of force, or pressure, with which a pressurization structure 12 is biased against backside 24 of a semiconductor device structure 20 assembled with wafer carrier 1' depends upon the distance between an actuator 14' and its corresponding pressurization structure 12.

As in the embodiment illustrated in FIGS. 1 and 2 and described with reference thereto, pressure application apparatus 10' shown in FIG. 3 may alternatively include actuators 14' that are oriented so as to magnetically attract their corresponding pressurization structures 12. Of course, the springs of such a pressure application apparatus 10' would be oriented so as to return pressurization structures 12 to a nonbiased state relative to backside 24 of semiconductor device structure 20 upon reducing or releasing the attractive magnetic field that biases pressurization structures 12 against backside 24.

Figure 4:
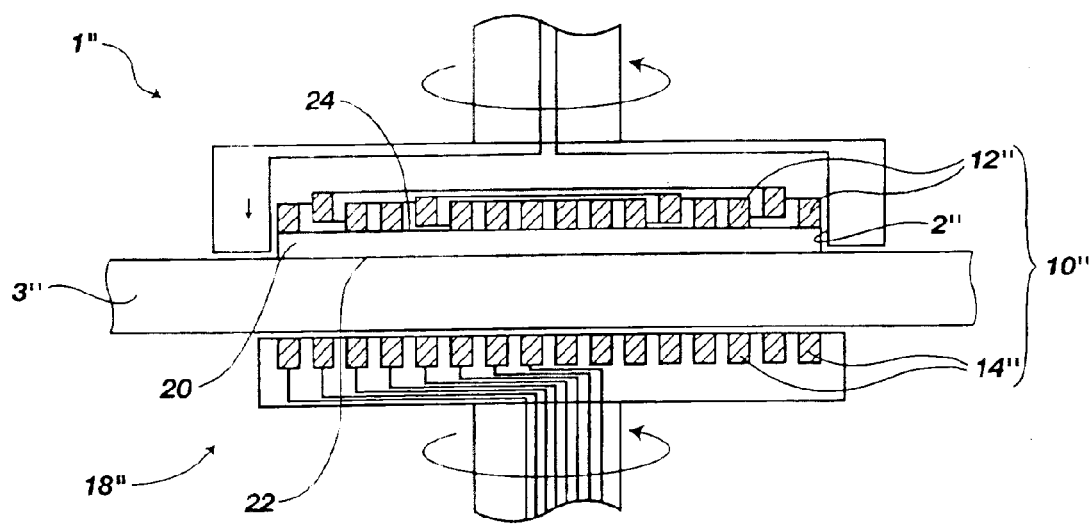
FIG. 4 is a cross-sectional representation of a third embodiment of an apparatus of the present invention.

Another embodiment of pressure application apparatus 10" incorporating teachings of the present invention is depicted in FIG. 4. While pressurization structures 12" are contained within a wafer carrier 1" within a receptacle 2" thereof, their corresponding actuators 14" are positioned in a separate actuation component 18", which is located on a side of a polishing pad 3" opposite from wafer carrier 1". As illustrated in FIG. 4, each actuator 14" of actuation component 18" is an electromagnet that corresponds to one pressurization structure 12". Actuators 14" are oriented so that at least their corresponding pressurization structures 12" are attracted toward actuators 14" upon application of current to actuators 14" to generate a magnetic field (i.e., opposite magnetic poles of pressurization structures 12" and their corresponding actuators 14" face one another). As actuators 14" are separated from their corresponding pressurization structures 12" by a semiconductor device structure 20 and a polishing pad 3" during use, the current that is applied to selected actuators 14" preferably generates a sufficiently large magnetic force field through polishing pad 3" and semiconductor device structure 20 to attract and bias the corresponding pressurization structures 12", as desired, against backside 24 of semiconductor device structure 20. The amounts of force that are applied by pressurization structures 12" to various locations of backside 24 prevent the formation of nonplanarities on active surface 22 of semiconductor device structure 20 during polishing of one or more layers thereof. Again, the amount of current applied to each electromagnet actuator 14" depends upon the desired amount of force to be applied by pressurization structures 12" against selected locations of backside 24 of semiconductor device structure 20.

Figure 5:
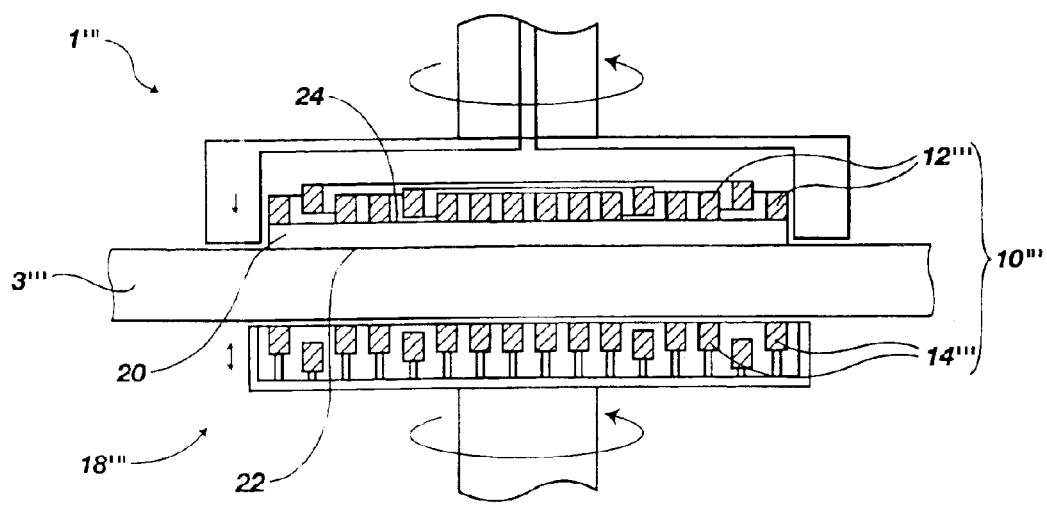
FIG. 5 is a cross-sectional representation of a fourth embodiment of an apparatus incorporating teachings of the present invention.

Referring now to FIG. 5, another exemplary embodiment of a pressure application apparatus 10''' according to the present invention is illustrated. Pressure application apparatus 10''' includes a wafer carrier 1''', such as that depicted in FIG. 4. Pressure application apparatus 10''' also includes an actuation component 18''' located adjacent a polishing pad 3''', on a side thereof opposite from wafer carrier 1'''. Actuation component 18''' includes actuators 14''' that are aligned with and correspond to pressurization structures 12''' of wafer carrier 1'''. Each actuator 14''', which may be moved vertically toward and away from its one or more corresponding pressurization structures 12''', is formed from a magnetic material. If pressurization structures 12''' are formed from a material that is attracted toward a magnetic field, such as a ferrous material, the amount of force each pressurization structure 12''' applies against backside 24 of a semiconductor device structure 20 assembled with wafer carrier 1''' increases the closer the corresponding actuator 14''' is moved toward polishing pad 3''' and wafer carrier 1'''. Likewise, pressurization structures 12''' may be formed from a known magnetic material and oriented so that opposite magnetic poles of each pressurization structure 12''' and its corresponding actuator 14''' are positioned closest to one another, or face one another. Again, upon moving an actuator 14''' toward one or more corresponding pressurization structures 12''', the increased magnetic forces acting on the one or more pressurization structures 12''' increase the amount of force applied by the one or more pressurization structures 12''' to backside 24 of a semiconductor device structure 20 assembled with wafer carrier 1'''.

Figure 6:
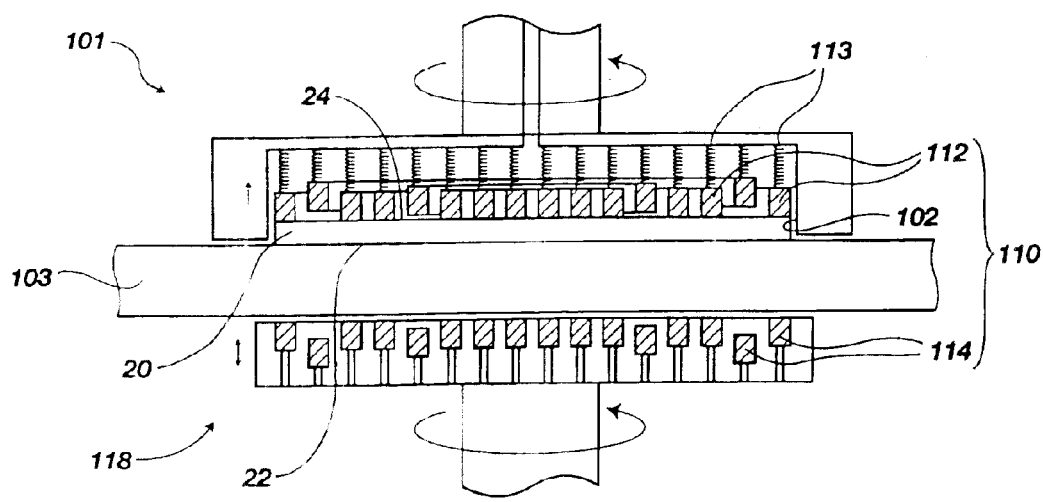
FIG. 6 is a cross-sectional representation of a fifth embodiment of an apparatus incorporating teachings of the present invention.

An alternative embodiment of a pressure application apparatus 110 incorporating teachings of the present invention is illustrated in FIG. 6. Pressure application apparatus 110 includes a wafer carrier 101 positioned on one side of a polishing pad 103 and an actuation component 118 positioned on the other side of polishing pad 103, opposite from wafer carrier 101.

Wafer carrier 101 includes a receptacle 102 formed therein and configured to receive a semiconductor device structure 20. Wafer carrier 101 also includes a plurality of pressurization structures 112, each formed from a magnetic material, located within receptacle 102. Each pressurization structure 112 moves substantially perpendicularly to a plane of a semiconductor device structure 20 disposed in receptacle 102 and, thus, assembled with wafer carrier 101. Pressurization structures 112 move independently from one another so as to facilitate the application of different amounts of pressures to different locations on backside 24 of semiconductor device structure 20. Each pressurization structure 112 includes an associated spring 113, such as a mechanical, coiled spring, a leaf spring, a Belleville spring, an elastomeric spring, a pneumatic (air) spring, or a combination thereof, positioned so as to cause the corresponding pressurization structure 112 to be biased against backside 24 of semiconductor device structure 20.

With continued reference to FIG. 6, actuation component 118 includes actuators 114 that correspond to pressurization structures 112 of wafer carrier 101. Each actuator 114 is independently movable toward and away from polishing pad 103, as well as the pressurization structure 112 that corresponds to actuator 114. Each actuator 114 is a magnet oriented so as to repel each corresponding pressurization structure 112 upon being moved toward that corresponding pressurization structure 112. Thus, like magnetic poles of pressurization structures 112 and their corresponding actuators 114 are positioned most closely to one another, or face one another. Upon movement of an actuator 114 toward polishing pad 103 and, thus, toward one or more corresponding pressurization structures 112, the one or more pressurization structures 112 are repelled, reducing the amount of force applied by the one or more pressurization structures 112 against backside 24 of semiconductor device structure 20 under bias of a spring 113. Once an actuator 114 is moved away from polishing pad 103 and, thus, away from one or more corresponding pressurization structures 112, spring 113 again relaxes to bias the one or more pressurization structures 112 against backside 24.

Figure 7:
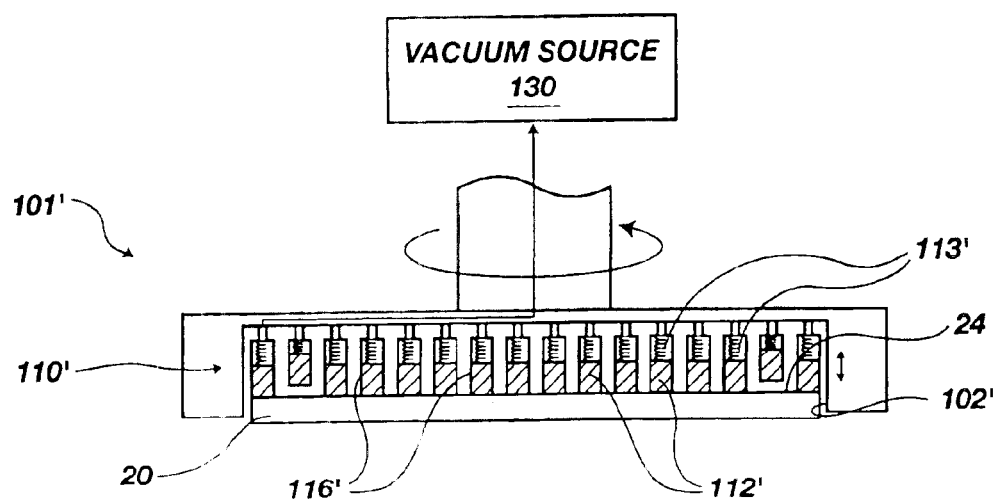
FIG. 7 is a cross-sectional representation of a sixth embodiment of pressure application apparatus of the present invention.

Still another embodiment of pressure application apparatus 110' incorporating teachings of the present invention is illustrated in FIG. 7. Pressure application apparatus 110' includes a wafer carrier 101' that includes a receptacle 102' and pressurization structures 112'. Receptacle 102' is configured to receive and retain a semiconductor device structure 20. Pressurization structures 112' may be annular in shape and are positioned so as to be biased against a backside 24 of a semiconductor device structure 20 assembled with wafer carrier 101'. Each pressurization structure 112' has associated therewith at least one spring 113' oriented so as to bias pressurization structure 112' against backside 24. Adjacent pressurization structures 112' are isolated from one another by way of sleeves 116'. In addition, each pressurization structure 112' has associated therewith a vacuum source 130. Vacuum source 130 may comprise separate vacuum sources for each pressurization structure 112'. Alternatively, vacuum source 130 may comprise a single vacuum source selectively connected to each pressurization structure 112' through a manifold. To vary the magnitude of vacuum or negative pressure applied, throttling valves may be employed between vacuum source 130 and each pressurization structure 112'. The amounts of negative pressure that may be applied to each pressurization structure 112' is, of course, independent from the amounts of negative pressure that may be applied to the other pressurization structures 112'. As a negative pressure is applied by vacuum source 130 to a pressurization structure 112', pressurization structure 112' is drawn away from backside 24 of a semiconductor device structure 20 within the confines of sleeve 116', thus reducing the amount of force or pressure applied by pressurization structure 112' to the corresponding locations of backside 24. As each pressurization structure 112' may be independently moved in this manner, different amounts of pressure may be applied to or withdrawn from backside 24.

Figure 8:
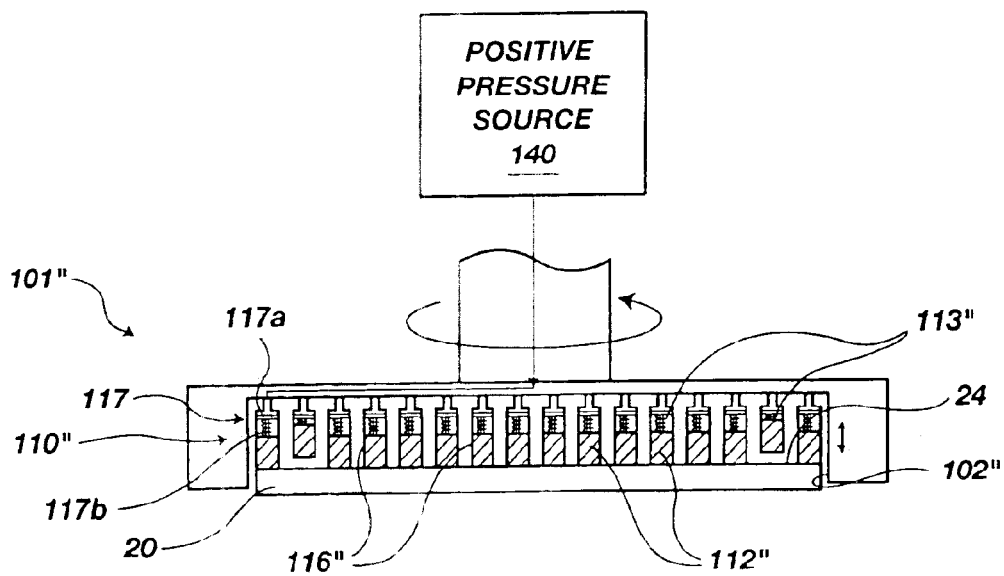
FIG. 8 is a cross-sectional representation of a seventh embodiment of pressure application apparatus of the present invention.

Another, similar embodiment of pressure application apparatus 110" is illustrated in FIG. 8. While pressure application apparatus 110" includes a wafer carrier 101" with a receptacle 102" and sleeves 116" that separate and confine adjacent pressurization structures 112" from one another, springs 113" are configured to maintain their corresponding pressurization structures 112" in a position away from a backside 24 of a semiconductor device structure 20 assembled with wafer carrier 101". A positive pressure source 140 is associated with each pressurization structure 112". Different amounts of positive pressure may be applied by positive pressure source 140 to a piston 117 adjacent each pressurization structure 112". As positive pressure source 140 applies positive pressure to a head 117a of piston 117, the corresponding pressurization structure 112" is moved by piston 117 against the resistance of the corresponding spring 113", which is coiled around a rod 117b of piston 117, and that pressurization structure 112" is biased against backside 24 of semiconductor device structure 20 with a desired amount of force or pressure. As such movement of each pressurization structure 112" is independent from that of the other pressurization structures 112", different amounts of pressure may be applied to backside 24 at different locations thereof to generate a force gradient to be applied across backside 24 of semiconductor device structure 20.

Figure 9A:
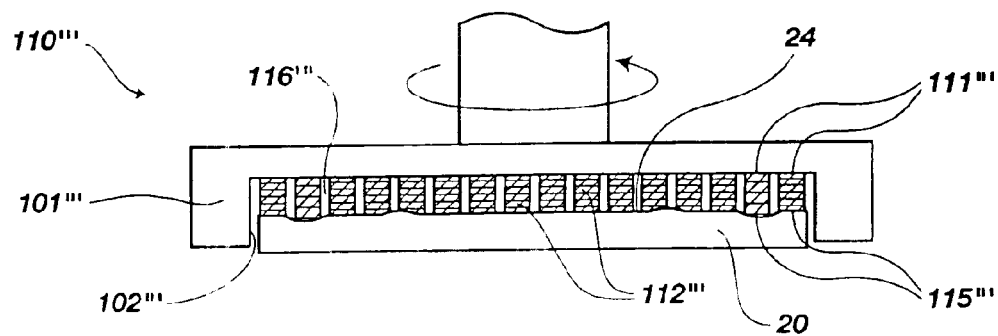
FIGS. 9A and 9B are schematic cross-sectional representations of an eighth embodiment of pressure application apparatus incorporating the teachings of the present invention, including pressurization structures that vary in thickness depending upon an amount of electric or magnetic field applied thereto.
Figure 9B:
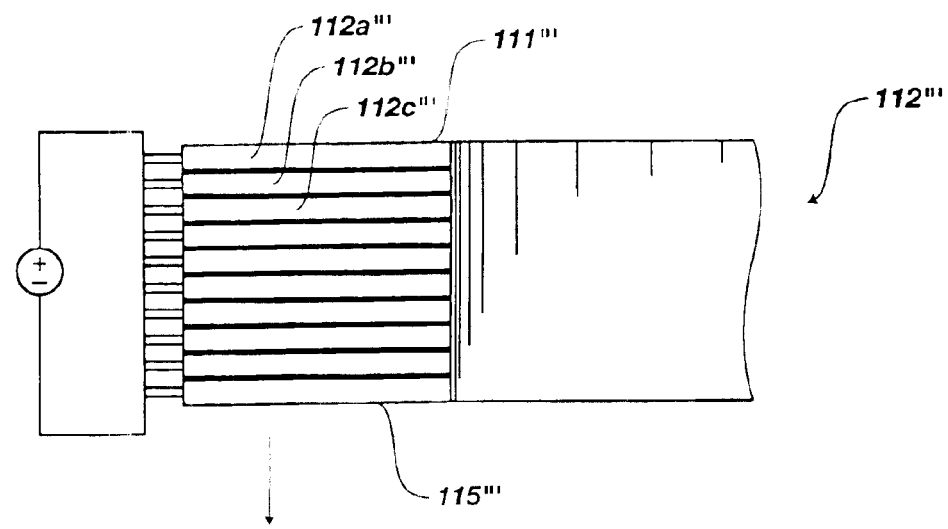

Yet another embodiment of pressure application apparatus 110''' is shown in FIGS. 9A and 9B. Pressure application apparatus 110''' includes a wafer carrier 101''' with a receptacle 102''' formed therein and configured to receive at least a backside 24 of a semiconductor device structure 20. Pressure application apparatus 110''' also includes, within receptacle 102''', a plurality of pressurization structures 112'''. Pressurization structures 112''' each include multiple layers 112a''', 112b''', 112c''', etc. of a material with a thickness dimension that changes upon varying a voltage or a magnetic field applied thereto. Exemplary materials include so-called piezoelectric, magnetostrictive, and electrostrictive materials. Known piezoelectric materials include, but are not limited to, poled polycrystalline ceramic materials, such as barium titanate and lead zercanate titanate. When piezoelectric or electrostrictive materials are used as pressurization structures 112''', a voltage may be applied, in parallel, to each of layers 112a''', 112b''', 112c''', etc. to change the thickness of each pressurization structure 112'''. Adjacent layers 112a''', 112b''', 112c''', etc. may be electrically isolated from one another. Preferably, the tops 111''' of pressurization structures 112''' are in a fixed position such that the bottoms 115''' of pressurization structures 112''' may exert pressure on backside 24 of semiconductor device structure 20 assembled with wafer carrier 101'''. Upon disposing semiconductor device structure 20 within receptacle 102''', bottoms 115''' of pressurization structures 112''' preferably contact backside 24. Upon applying a voltage to each pressurization structure 112''', the overall thickness of pressurization structure 112''' increases, causing bottom 115''' of that pressurization structure 112''' to be forced against backside 24 of semiconductor device structure 20 and, thereby, to apply a desired amount of pressure to an appropriate location of backside 24 of semiconductor device structure 20. Alternatively, magnetic fields of varying strength may be selectively applied to pressurization structures 112''' formed from known magnetostrictive materials to selectively vary the thicknesses of pressurization structures 112'''. Preferably, if magnetostrictive materials are used as pressurization structures 112''', the magnetic fields that are used to vary the thicknesses of adjacent pressurization structures 112''' are substantially isolated from one another by way of sleeves 116'''.

Figure 10:
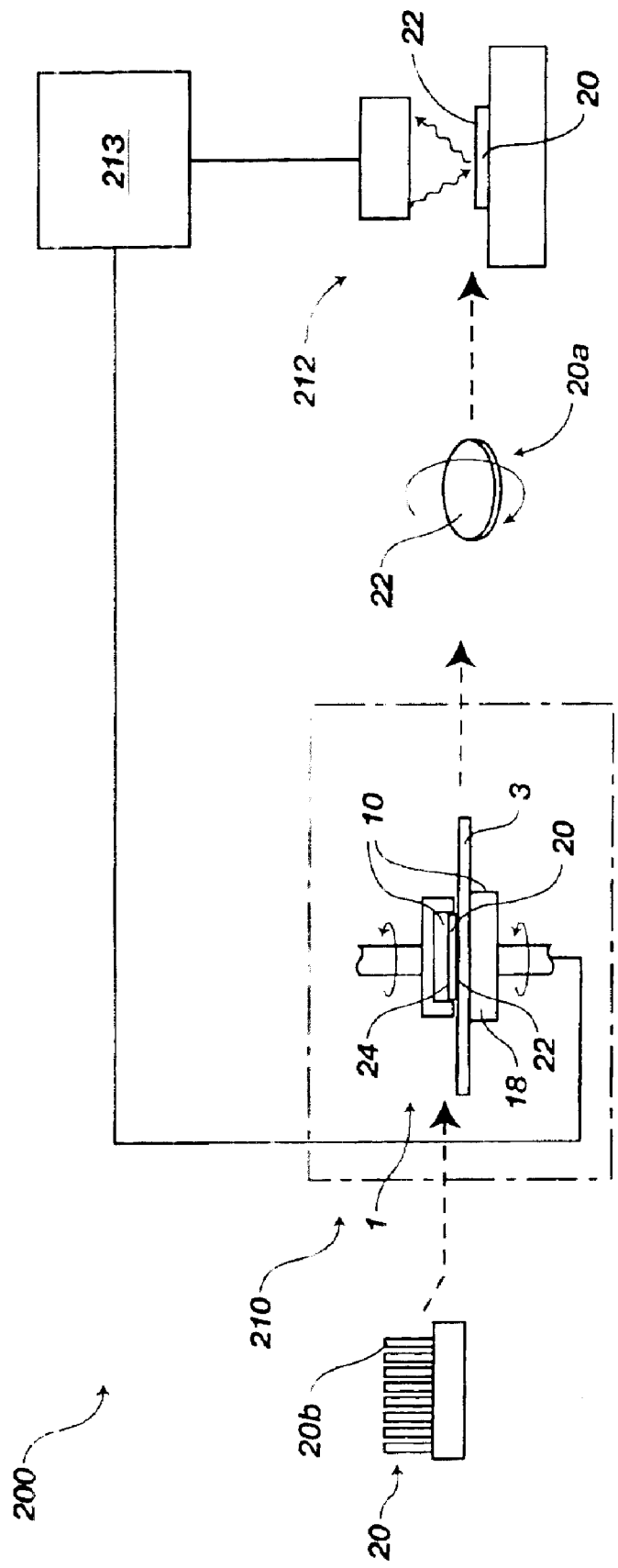
FIG. 10 is a schematic representation of a system that includes the apparatus of the invention and that effects the substantially planar polishing of semiconductor device structures in response to nonplanarities that are formed on a semiconductor device structure of like type when an apparatus of the invention is not used.

FIG. 10 schematically illustrates a polishing system 200 that includes a polishing apparatus 210 with a pressure application apparatus 10, including a wafer carrier 1, and a polishing pad 3. Polishing apparatus 210 of polishing system 200 may comprise any known type of polishing apparatus, such as a conventionally configured polishing apparatus with a rotating pad, a web-format polishing apparatus, or a belt-format polishing apparatus. Although the reference numeral 10 is used herein to identify a pressure application apparatus, any embodiment of pressure application apparatus incorporating teachings of the present invention may be used in polishing system 200. If polishing system 200 includes a wafer carrier 1 that precesses (i.e., undergoes compound rotation around more than one axis) or includes pressurization structures 12 that are not annular in shape and wafer carrier 1 is separate from actuation component 18 and positioned on a side of a polishing pad 3 opposite therefrom, then actuation component 18 is preferably moved laterally relative to polishing pad 3 in a fashion that substantially mirrors, or tracks, the lateral movement of wafer carrier 1 relative to polishing pad 3 (e.g., during precessing), thus maintaining the alignment of pressurization structures 12 and their corresponding actuators 14, as well as the amount of force applied by each pressurization structure 12 (FIG. 1) against backside 24 of a semiconductor device structure 20 assembled with wafer carrier 1 during polishing of active surface 22 of semiconductor device structure 20.

In using a pressure application apparatus incorporating teachings of the present invention while polishing a semiconductor device structure 20, semiconductor device structure 20 is assembled with and secured to a wafer carrier, such as wafer carrier 1 shown in FIG. 1. The wafer carrier may then be moved toward a polishing pad 3, such that semiconductor device structure 20 is brought into contact with the polishing pad. Desired amounts of pressure are applied to different locations on backside 24 of semiconductor device structure 20 by pressurization structures, such as pressurization structures 12 shown in FIG. 1, under control of corresponding actuators, such as actuators 14 shown in FIG. 1. Preferably, pressure is not applied to backside 24 of semiconductor device structure 20 until active surface 22 of semiconductor device structure 20 is disposed against and supported by the polishing pad, thereby preventing the occurrence of fractures or cracks that could otherwise be caused in semiconductor device structure 20 if pressure were applied to backside 24 thereof prior to disposing active surface 22 thereof against the polishing pad. The wafer carrier is then rotated so as to effect polishing of active surface 22 of semiconductor device structure 20. Preferably, the pressure applied to different locations of backside 24 of semiconductor device structure 20 causes areas on active surface 22 that would otherwise be raised to be polished at an increased rate, thereby creating a substantially planar active surface 22.

Polishing system 200 may also include a metrology component 212 and a processor 213 associated with polishing apparatus 210. Metrology component 212, which is of a type known in the art, is configured to analyze a topography of an active surface 22 of a semiconductor device structure 20. This analysis of the topography of active surface 22 of semiconductor device structure 20 is communicated from metrology component 212 to processor 213 by way of one or more signals embodied in carrier waves. Processor 213, under control of one or more programs, determines an amount of pressure to be applied at selected locations of backside 24 of semiconductor device structure 20 to counteract and reduce nonplanarities formed on active surface 22 during polishing of a certain type of material at a certain rotational speed and for a certain duration. Such a force gradient may be relatively consistent for semiconductor device structures 20 of the same type.

As an example of the use of polishing system 200, a first semiconductor device structure 20a of a group of semiconductor device structures 20 is polished by polishing apparatus 210 using conventional processes. Following polishing of active surface 22 of first semiconductor device structure 20a, the topography of active surface 22 is analyzed by metrology component 212. Data representative of the analysis of active surface 22 by metrology component 212 is communicated to processor 213, which also considers other facts, such as data regarding the rate at which material was removed from a lowermost region of active surface 22 to identify an amount of pressure to be applied to selected portions of backside 24 of at least one subsequently polished semiconductor device structure 20b of the same type as semiconductor device structure 20a so as to reduce or eliminate the occurrence of nonplanarities on active surface 22 of semiconductor device structure 20b. Processor 213 communicates with actuation component 18 so as to control the movement of actuators 14 or the strength of the magnetic field generated by actuators 14, in turn controlling the amount of force with which each pressurization structure 12 of wafer carrier 1 is biased against backside 24 of semiconductor device structure 20b. Processor 213 and pressure application apparatus 10 thereby generate a force, or pressure, gradient to be applied to backside 24 of semiconductor device structure 20. Of course, data representative of the topography of active surface 22 of semiconductor device structure 20 may be used in manual calculations to determine the amount of force to apply to selected locations of backside 24 of semiconductor device structure 20b. Actuation component 18 may similarly be manually controlled so as to apply desired amounts of pressure to different locations of backside 24 of semiconductor device structure 20b.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A system for polishing a semiconductor device structure, comprising:
   a metrology component for detecting any raised areas on an active surface of the semiconductor device structure;
   a support structure configured to receive the semiconductor device structure;
   a pressurization component including:
      a plurality of independently movable pressurization structures; and
      actuators corresponding to each of the plurality of pressurization structures, the actuators each being configured to bias a corresponding pressurization structure against a backside of the semiconductor device structure with a selected amount of force; and
   a polishing component.

2. The system of claim 1, wherein each of the plurality of pressurization structures comprises a magnetized material.

3. The system of claim 1, wherein each of the plurality of pressurization structures comprises a material that is attracted to a magnetic field.

4. The system of claim 3, wherein each of the plurality of pressurization structures comprises a ferrous material.

5. The system of claim 3, wherein each of the plurality of pressurization structures comprises a magnetized material.

6. The system of claim 1, wherein each of the plurality of pressurization structures has an annular shape.

7. The system of claim 1, wherein each of the actuators comprises a magnetic controller.

8. The system of claim 7, wherein each the magnetic controller comprises a magnet.

9. The system of claim 8, wherein each the magnetic controller comprises an electromagnet.

10. The system of claim 8, wherein each the magnetic controller is oriented and located so as to repel a corresponding pressurization structure toward a backside of a semiconductor device structure assembled with the support structure.

11. The system of claim 8, wherein each the magnetic controller is oriented and located so as to attract a corresponding pressurization structure toward a backside of a semiconductor device structure assembled with the support structure.

12. The system of claim 1, wherein the actuators comprise a positive pressure source.

13. The system of claim 1, wherein the actuators comprise a negative pressure source.

14. The system of claim 13, wherein the pressurization component further comprises at least one spring associated with each of the plurality of independently movable pressurization structures.

15. The system of claim 14, wherein the at least one spring biases a corresponding pressurization structure against the backside.

16. The system of claim 15, wherein the negative pressure source is configured to withdraw the corresponding pressurization structure away from the backside.

17. The system of claim 1, wherein each actuator is configured to bias a corresponding pressurization structure against a backside of a semiconductor device structure assembled with the support structure with variable amounts of force.

18. The system of claim 1, wherein the polishing component comprises a mechanical polishing apparatus.

19. The system of claim 1, wherein the polishing component comprises a chemical-mechanical polishing apparatus.

20. The system of claim 1, wherein the polishing component includes assembled therewith a rotatable polishing pad.

21. The system of claim 1, wherein the polishing component includes an element for rotating the semiconductor device structure in a plane thereof and relative to a polishing pad assembled with the polishing component.

* * * * *

UNITED STATES PATENT AND TRADEMARK OFFICE
CERTIFICATE OF CORRECTION

PATENT NO. : 6,899,607 B2  
APPLICATION NO. : 10/715248  
DATED : May 31, 2005  
INVENTOR(S) : Nathan R. Brown Page 1 of 1

It is certified that error appears in the above-identified patent and that said Letters Patent is hereby corrected as shown below:

| | | | |
|---|---|---|---|
| CLAIM 8, | COLUMN 14, | LINE 21, | after "each" and before "magnetic" delete "the" |
| CLAIM 9, | COLUMN 14, | LINE 23, | after "each" and before "magnetic" delete "the" |
| CLAIM 10, | COLUMN 14, | LINE 25, | after "each" and before "magnetic" delete "the" |
| CLAIM 11, | COLUMN 14, | LINE 30, | after "each" and before "magnetic" delete "the" |

Signed and Sealed this

Twenty-third Day of October, 2007

JON W. DUDAS  
*Director of the United States Patent and Trademark Office*